United States Patent [19]

Hayami et al.

[11] Patent Number: 5,795,494
[45] Date of Patent: Aug. 18, 1998

[54] SEMICONDUCTOR SUBSTRATE CLEANING METHOD AND SEMICONDUCTOR DEVICE FABRICATION METHOD

[75] Inventors: Yuka Hayami; Miki T. Suzuki; Hiroki Ogawa; Shuzo Fujimura; Haruhisa Mori; Yoshiko Okui, all of Kawasaki, Japan

[73] Assignee: Fujitsu Limited, Kawasaki, Japan

[21] Appl. No.: 513,748

[22] Filed: Aug. 10, 1995

[30] Foreign Application Priority Data

Dec. 19, 1994 [JP] Japan ................... 6-314392

[51] Int. Cl.$^6$ ................................. H01L 21/02
[52] U.S. Cl. ................. 216/83; 134/2; 134/42; 216/96; 216/99; 216/101
[58] Field of Search ................... 216/83, 96, 101, 216/99; 134/1.3, 2, 30, 31, 42

[56] References Cited

U.S. PATENT DOCUMENTS

| | | | |
|---|---|---|---|
| 4,722,752 | 2/1988 | Steck | 134/30 |
| 5,176,756 | 1/1993 | Nakashima et al. | 134/1.3 |
| 5,451,267 | 9/1995 | Stadler et al. | 134/30 |
| 5,464,480 | 11/1995 | Matthews | 216/83 |
| 5,567,244 | 10/1996 | Lee et al. | 134/3 |

FOREIGN PATENT DOCUMENTS

| | | |
|---|---|---|
| 43 40 589 | 12/1992 | Germany . |
| 01-150328 | 6/1989 | Japan . |
| 2-164035 | 6/1990 | Japan . |
| 03-157927 | 7/1991 | Japan . |
| 04-040270 | 2/1992 | Japan . |
| 04-124825 | 4/1992 | Japan . |
| 4-151835 | 5/1992 | Japan . |
| 6-053201 | 2/1994 | Japan . |
| 843 029 | 5/1982 | U.S.S.R. . |

OTHER PUBLICATIONS

Journal of the Electrochemical Society, vol. 140, No. 3, Mar. 1993, T. Ohmi et al., "Native Oxide Growth and Organic Impurity Removal on Si Surface with Ozone–Injected Ultra-pure Water"—pp. 804–810.

*Primary Examiner*—T. Tung
*Attorney, Agent, or Firm*—Armstrong, Westerman Hattori, McLeland & Naughton

[57] ABSTRACT

Semiconductor substrates are immersed in pure water having a lowered dissolved-oxygen concentration and heated to a temperature above 60° C., in an atmosphere which keeps the dissolved oxygen concentration in pure water, in order to etch oxide films on surfaces of the semiconductor substrates for cleaning the surfaces of the semiconductor substrates. According to the present invention, contaminants and residual chemicals can be effectively removed without adding any chemical treating step. The cleaning can be effective without increasing the number of chemicals, and improved throughputs of the cleaning step can be obtained.

11 Claims, 14 Drawing Sheets

SEMICONDUCTOR SUBSTRATE CLEANING METHOD AND SEMICONDUCTOR DEVICE FABRICATION METHOD

BACKGROUND OF THE INVENTION

The present invention relates to a semiconductor substrate cleaning method used in a fabrication process for a semiconductor device, and a semiconductor device fabrication method using the cleaning method.

Recently it is required in the semiconductor device fabrication industry that semiconductor integrated circuits of high quality be produced efficiently without lowering throughputs and yields. To this end, it is expected that more effective semiconductor substrate cleaning methods will be developed.

In the conventional generally used semiconductor substrate cleaning method, chemical immersion with many kinds of chemicals, and water cleaning are repeated so as to remove contaminants, such as particles, metallic contaminants, organic substances, etc.

But in the conventional semiconductor substrate cleaning method, more chemical treatment steps increase cleaning time. This results in lower throughputs. This has been a problem.

For example, in using a cleaning chemical of high viscosity, the usual following water cleaning cannot fully remove the treated chemical. In addition, this lowers product yields. This has been also a problem.

SUMMARY OF THE INVENTION

An object of the present invention is to provide a semiconductor substrate cleaning method which can effectively remove contaminants and residual chemicals without increasing the number of chemical treatment steps.

Another object of the present invention is to provide a semiconductor device fabrication method which can fabricate a semiconductor device of high quality by the use of the semiconductor substrate cleaning method without lowering product yields.

The above-described object is achieved by a semiconductor substrate cleaning method in which semiconductor substrates are immersed in pure water having a lowered dissolved-oxygen concentration and a temperature above 60° C., in an atmosphere which controls oxygen concentration to keep the dissolved oxygen concentration in the pure water, whereby the semiconductor substrates are cleaned to etch oxide films on surfaces of the semiconductor substrates.

In the above-described semiconductor substrate cleaning method, it is preferable that the atmosphere is shielded from the outside air so that the dissolved oxygen concentration in the pure water is kept.

In the above-described semiconductor substrate cleaning method, it is preferable that an oxygen concentration in the atmosphere is adjusted so that the dissolved oxygen concentration in the pure water is kept.

In the above-described semiconductor substrate cleaning method, it is preferable that a dissolved oxygen concentration in the pure water is below 200 ppb at room temperature.

In the above-described semiconductor substrate cleaning method, it is preferable that the semiconductor substrates are immersed in the pure water for more than 10 minutes.

In the above-described semiconductor substrate cleaning method, it is preferable that the pure water is at a temperature above 80° C.

In the above-described semiconductor substrate cleaning method, it is preferable that the pure water is at a temperature above 90° C.

In the above-described semiconductor substrate cleaning method, it is preferable that the semiconductor substrates are cleaned so that the semiconductor substrates after cleaning form a contact angle of above 70° by controlling a temperature of the pure water, and a time during which the semiconductor substrates are immersed in the pure water.

In the above-described semiconductor substrate cleaning method, it is preferable that the oxide films on the surfaces of the semiconductor substrates are chemical oxide films formed by immersing the semiconductor substrates in a chemical solution.

In the above-described semiconductor substrate cleaning method, it is preferable that the chemical solution is a mixture of ammonium water, hydrogen peroxide and pure water.

In the above-described semiconductor substrate cleaning method, it is preferable that the oxide films on the surfaces of the semiconductor substrates are native oxide films formed by letting the semiconductor substrates expose in the oxygen-content atmosphere, or immersing the semiconductor substrates in pure water having higher dissolved oxygen concentration.

In the above-described object is also achieved by a semiconductor device fabrication method including a step of cleaning surfaces of semiconductor substrates by the above-described semiconductor substrate cleaning method.

According to the semiconductor substrate cleaning method of the present invention, semiconductor substrates are immersed in pure water having a low dissolved oxygen concentration and heated to a temperature above 60° C., in an atmosphere which keeps the dissolved oxygen concentration in pure water, to etch oxide films on the surfaces of the semiconductor substrates, whereby contaminants and residual chemicals can be effectively removed without adding any chemical treating step. The cleaning can be effective without increasing the number of chemicals, and improved throughputs of the cleaning step can be obtained.

The atmosphere is shielded from the outside air, whereby semiconductor substrates can be cleaned with the dissolved oxygen concentration in the pure water kept low.

An oxygen concentration in the atmosphere is adjusted so that the dissolved oxygen concentration in the pure water is kept low, whereby semiconductor substrates can be cleaned by the cleaning effect of the pure water having a low dissolved oxygen concentration, hereinafter known as low dissolved-oxygen pure water.

A dissolved oxygen concentration in the pure water is below 200 ppb at room temperature, whereby contaminants adhered to the surfaces of the semiconductor substrates can be effectively removed.

Semiconductor substrates are immersed in the low dissolved-oxygen pure water for more than 10 minutes, whereby contaminants adhered to the surfaces of the semiconductor substrates can be removed.

The low dissolved-oxygen pure water is heated to a temperature above 80° C., whereby contaminants adhered to the surfaces of the semiconductor substrates can be effectively removed.

The low dissolved-oxygen pure water is heated to a temperature above 90° C., whereby contaminants adhered to the surfaces of semiconductor substrates can be more effectively removed.

A temperature of the low dissolved-oxygen pure water, and a time during which the semiconductor substrates are immersed in the low dissolved-oxygen pure water, are controlled to clean the semiconductor substrates so that the contact angle of semiconductor substrate with the pure water becomes above 70°, whereby contaminants adhered to the surfaces of the semiconductor substrates can be effectively removed.

The above-described semiconductor substrate cleaning method is applicable to the cleaning step for cleaning semiconductor substrates with chemical oxide films formed thereon by immersing the semiconductor substrates in a chemical.

The above-described semiconductor substrate cleaning method is applicable to the cleaning step for cleaning semiconductor substrates with chemical oxide films formed thereon formed by a mixed liquid of an aqueous solution of ammonium, hydrogen peroxide and pure water.

The above-described semiconductor substrate cleaning method is applicable to the cleaning step for cleaning semiconductor substrates with native oxide films formed by exposing the semiconductor substrates in an oxygen-content atmosphere or immersing the semiconductor substrates in pure water having a higher dissolved oxygen concentration.

The above-described semiconductor substrate cleaning method is used to clean semiconductor substrates in a semiconductor device fabrication process, whereby contaminants and chemical residue can be effectively removed without increasing a number of chemical treatments. A semiconductor device fabrication method which can fabricate semiconductor devices of high quality without lowering product yields can be provided.

BRIEF DESCRIPTION OF THE INVENTION

The semiconductor substrate cleaning method according to a first embodiment of the present invention, and the semiconductor substrate cleaning equipment used in the first embodiment will be explained with reference to FIGS. 1 to 14.

First the structure of the cleaning equipment used in the present embodiment will be explained.

Figure 1:
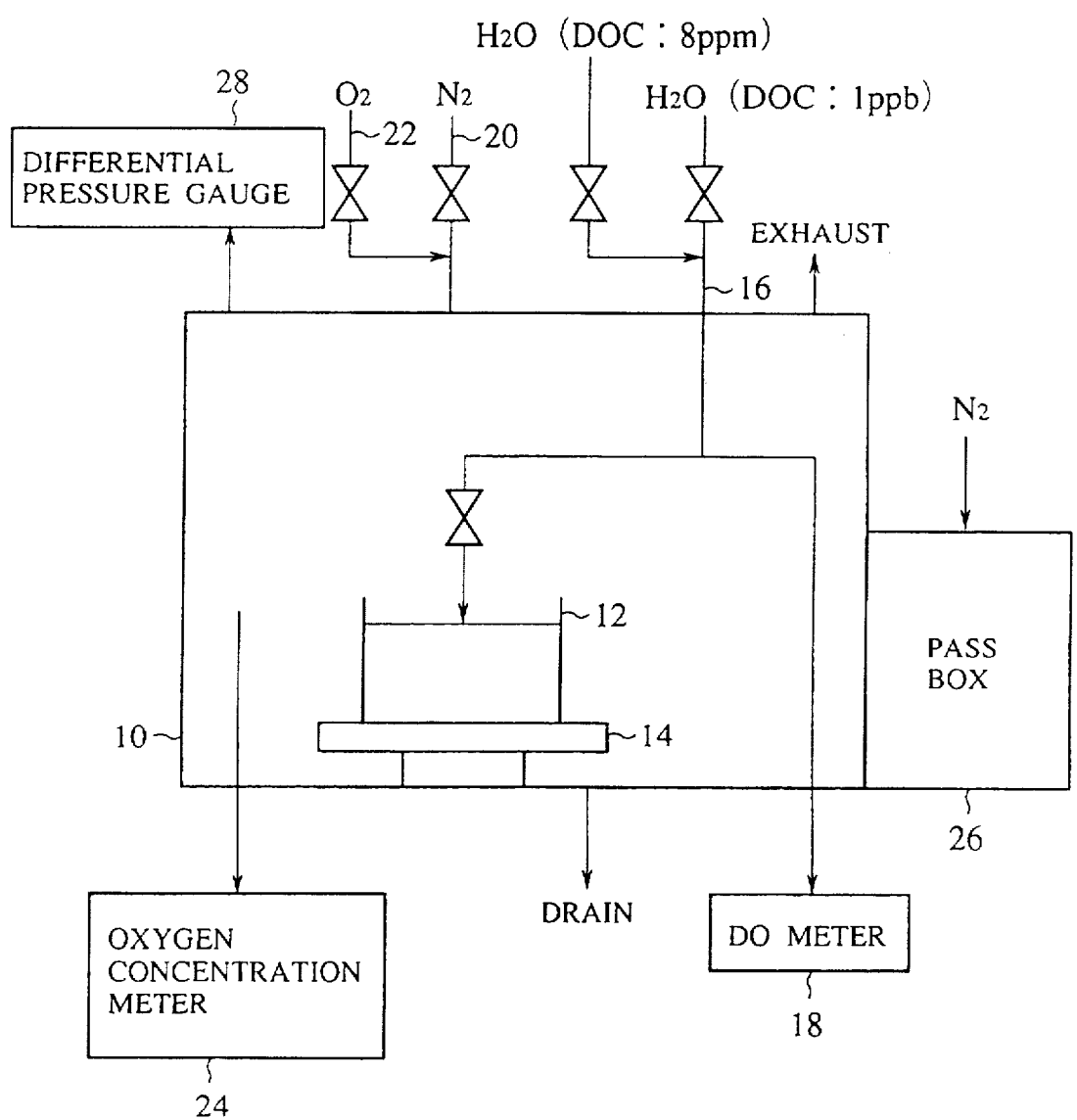
FIG. 1 shows a diagrammatic view of the semiconductor substrate cleaning equipment according to one embodiment of the present invention.

FIG. 1 is a diagrammatic view of the semiconductor substrate cleaning equipment used in the present embodiment.

The cleaning equipment is enclosed by a box 10 so that the inside of the cleaning equipment is shielded from the outside air. In the box 10 there are provided a pure water bath 12 for cleaning semiconductor substrates, and a heater 14 which heats a cleaning liquid to be fed into the pure water bath 12. The pure water bath 12 has a pure water feed pipe 16 which supplies pure water into the pure water bath 12. The pure water feed pipe 16 is connected to a DO meter which detects dissolved oxygen concentrations in the pure water to be supplied into the pure water bath 12.

Outside the box 10, there are provided a differential pressure gauge 28 which measures pressure differences between the outside of the box and the inside of the box 10, a nitrogen feed pipe 20 and an oxygen feed pipe 22, so that ambience in the inside of the box can be controlled. In the present embodiment, oxygen concentrations in the box 10 are monitored by an oxygen concentration meter 24 and are controlled to be below 25 ppm at 25° C.

The inside of the cleaning equipment is thus shielded from the outside to control an ambience in the equipment because when pure water having a low dissolved oxygen content is left in normal atmospheric air, oxygen in the atmospheric air solves into the pure water, and the dissolved oxygen concentration cannot be kept low.

The box 10 has a pass box 26 which prevents the outside air from coming into the box 10 when semiconductor substrates are loaded into the box 10. When semiconductor substrates are loaded into the box 10, the semiconductor substrates are temporarily loaded in the pass box 26, and inside of the pass box 26 is replaced with an inert gas, e.g., nitrogen, and then the semiconductor substrates are loaded into the box 10.

Then, the method for cleaning semiconductor substrates using the semiconductor substrate cleaning equipment will be explained.

Figure 2:
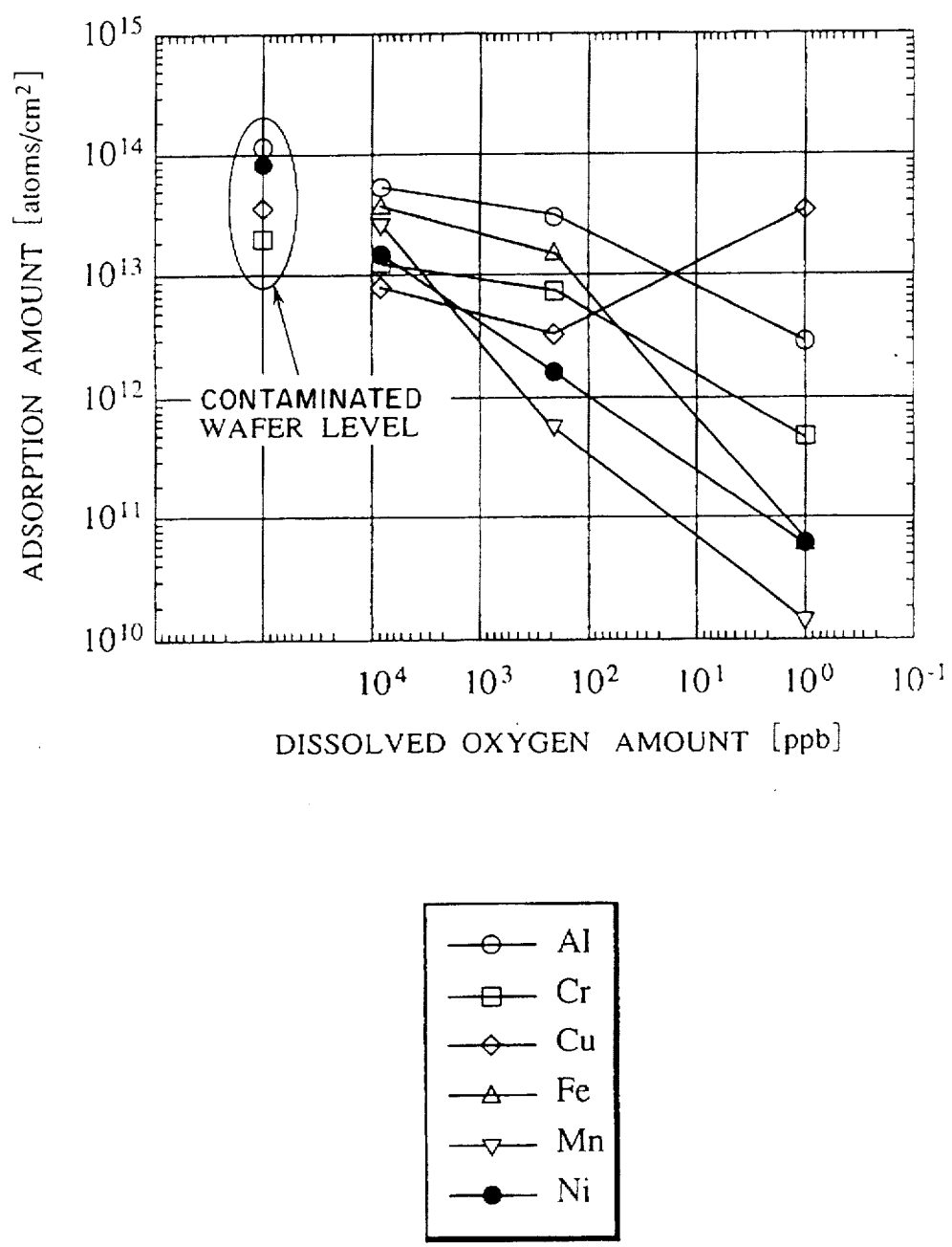
FIG. 2 shows a graph of relationships between amounts of metal adsorption on semiconductor substrates cleaned by the semiconductor substrate cleaning method according to the embodiment of the present invention, and dissolved oxygen concentration.
Figure 3:
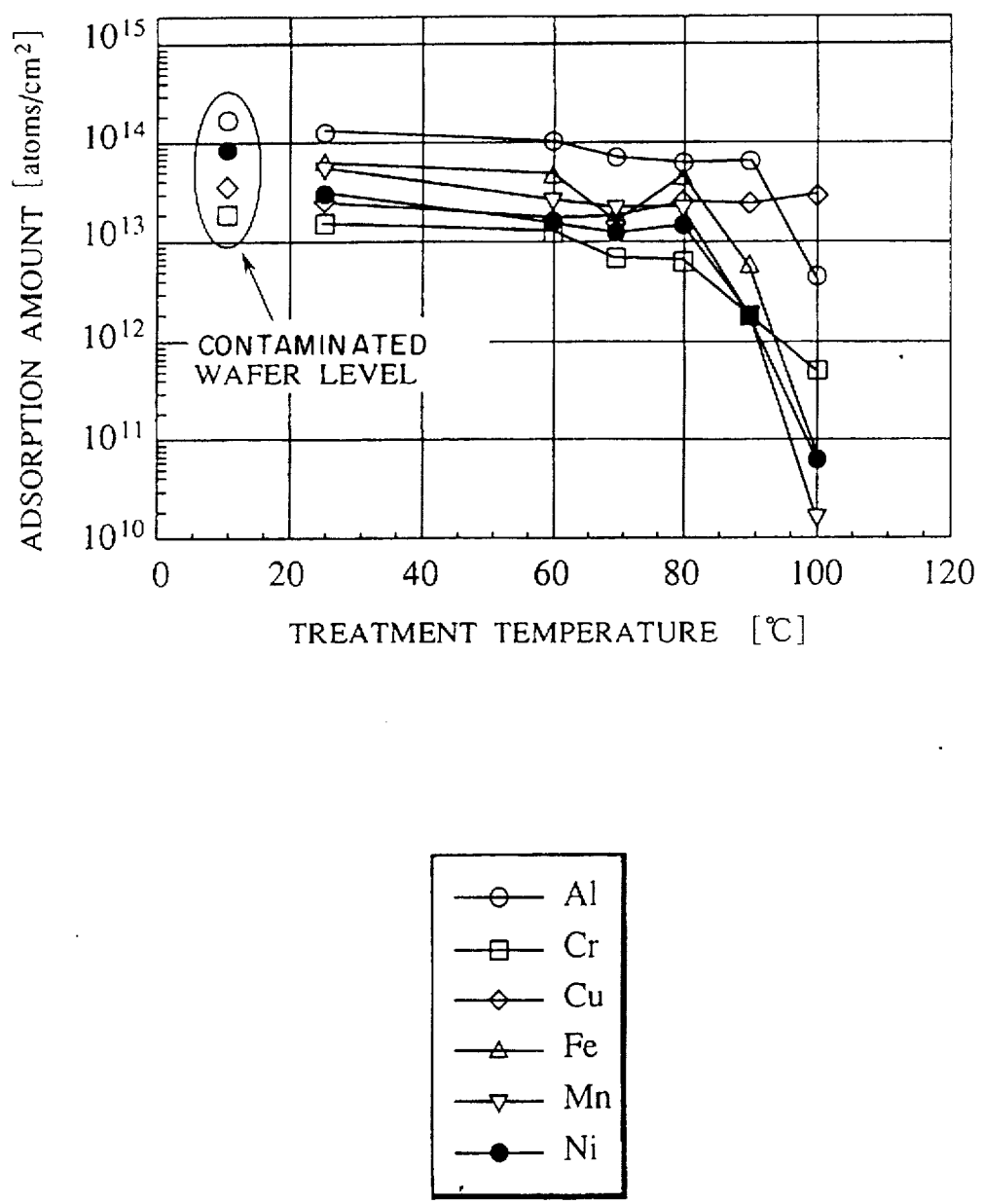
FIG. 3 shows a graph of relationships between amounts of metal adsorption on semiconductor substrates cleaned by the semiconductor substrate cleaning method according to the embodiment of the present invention, and treatment temperatures.
Figure 4:
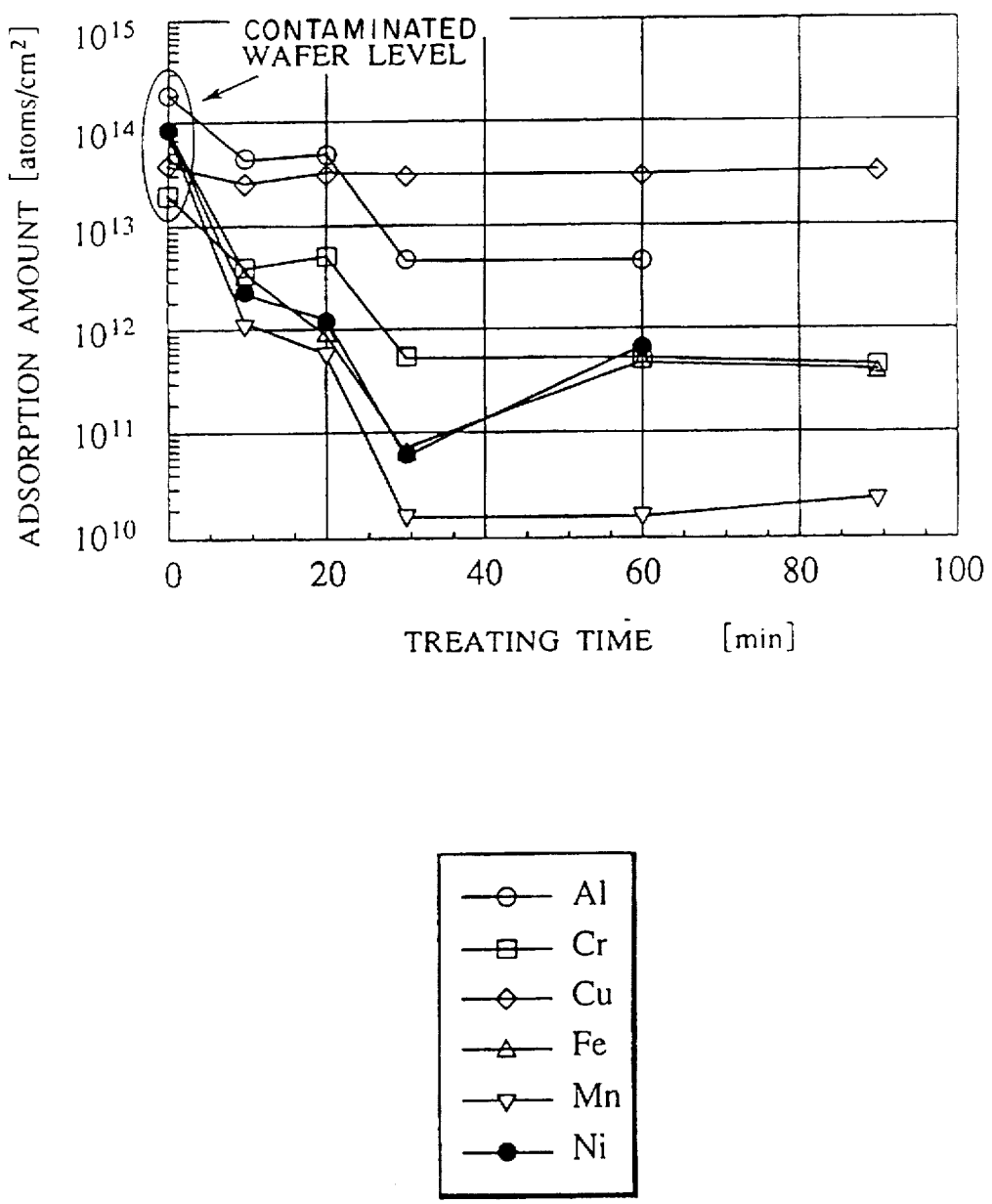
FIG. 4 shows a graph of relationships between amounts of metal adsorption on semiconductor substrates cleaned by the semiconductor substrate cleaning method according to the embodiment of the present invention, and treatment time.

FIG. 2 shows the dependency of the amount of residual metallic contamination on the dissolved oxygen concentration in pure water. FIG. 3 shows the dependency of the amount of residual metallic contamination on the treatment temperature. FIG. 4 shows the dependency of the amount of residual metallic contamination on the treatment time.

FIG. 2 shows dissolved oxygen concentration dependence with the cleaning effect measured in a case that semiconductor substrates were immersed in pure water for 30 minutes at a 100° C. pure water temperature.

To confirm the effect of removing metallic contaminants from the surfaces of semiconductor substrates by the cleaning, the metallic contaminants had been intentionally applied to the surfaces of the semiconductor substrates before the cleaning. The intentionally contaminated semiconductor substrates were prepared by treating p-type and n-type (100)-oriented silicon substrates having a resistivity about 10 Ω-cm with hydrogen fluoride to remove oxide films on the surfaces of the semiconductor substrates, and then immersing the semiconductor substrates in an SC-1 solution added to an atomic absorption spectrometry standard solution containing Al, Cd, Co, Cr, Cu, Fe, Mg, Mn and Ni for chemical treatment.

As shown, metallic contaminant amounts adsorbed on the surfaces of the semiconductor substrate was decreased by the cleaning of the semiconductor substrate with the pure water. The removing effect increased as the dissolved oxygen concentration in the pure water was decreased to 200 ppb and to 1 ppb. Especially when the dissolved oxygen concentration was decreased to 1 ppb, the effect was conspicuous, and the effect of removing the metallic contaminants except Cu could be drastically improved.

FIG. 3 shows pure water temperature dependence with the cleaning effect when a dissolved oxygen concentration in the pure water was 1 ppb, and treatment time was 30 minutes.

As shown, when a treatment temperature is below about 60° C., the metallic contaminant removing effect does not substantially depend on the treatment temperature.

But when a treatment temperature is above 60° C., the effect of the metallic contaminants removal except Cu was improved. Especially when the treatment temperature rose to above 80° C., the removing effect abruptly increased. When the treatment temperature was raised above 90° C., the removing effect was improved, and a contamination amount of Al, on which the removing effect was low, could be decreased to below 1/10 of initial amount.

Treatment time dependence of the cleaning effect with a dissolved oxygen concentration in the pure water set at 1 ppb and a treatment temperature set at 100° C. is shown in FIG. 4.

As shown, the adsorption amounts of metallic contaminants except Cu gradually decreased in 10 minutes of the treatment and decreased further with further increases of time of the immersion. But after 30 minutes of the treatment the adsorption amounts did not decrease, and thereafter no substantial changes took place in the adsorption amounts. Thus, the effect of removing metallic contaminants by the use of low dissolved-oxygen pure water is considered to reach an equilibrium.

Thus, metallic contaminants can be removed by the use of low dissolved-oxygen pure water. This mechanism will be explained below.

Figure 5:
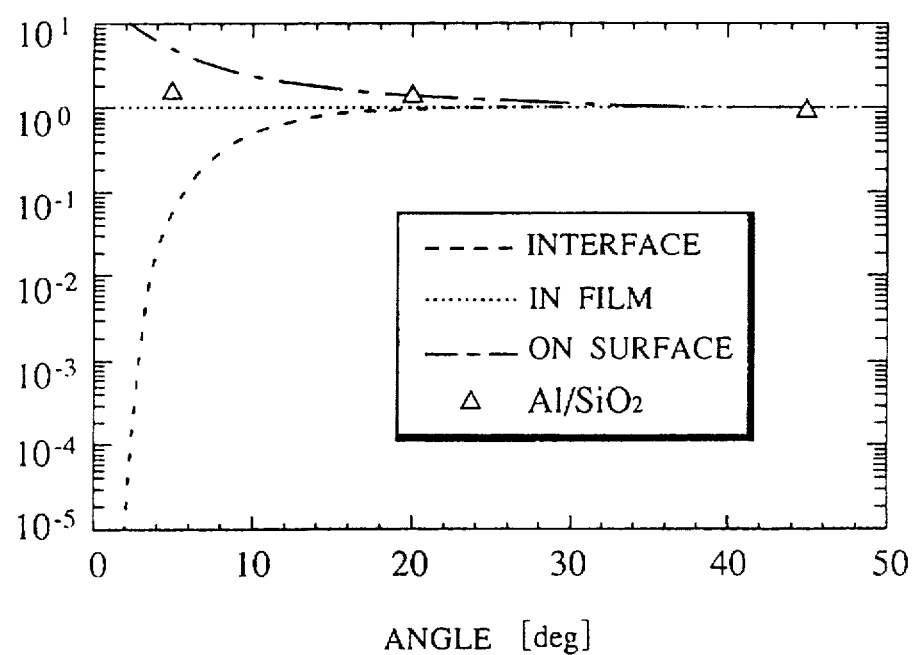
FIG. 5 shows a graph showing the depth profile of the contaminant Al of the semiconductor substrates, prepared in the embodiment of the present invention, measured by XPS.
Figure 6A:
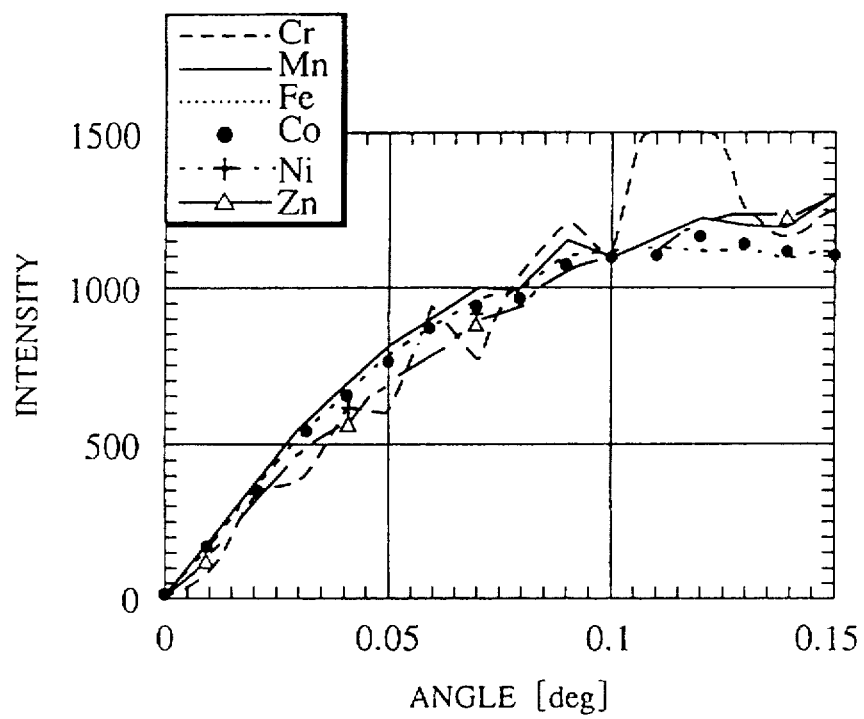
FIG. 6A shows a graph showing the result of TRXF observation measured on the contaminated semiconductor substrates prepared in the embodiment of the present invention.
Figure 6B:
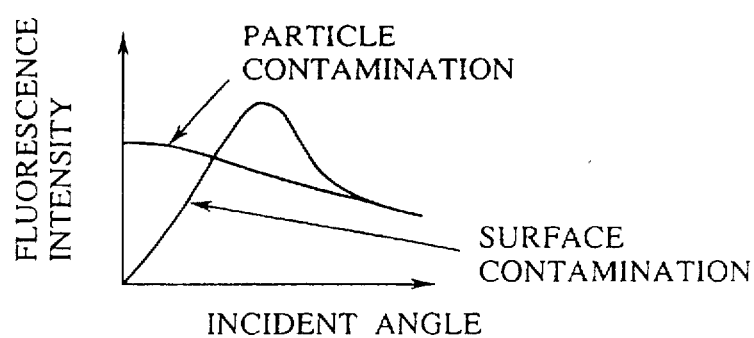
FIG. 6B shows a graph explaining FIG. 6A.
Figure 7:
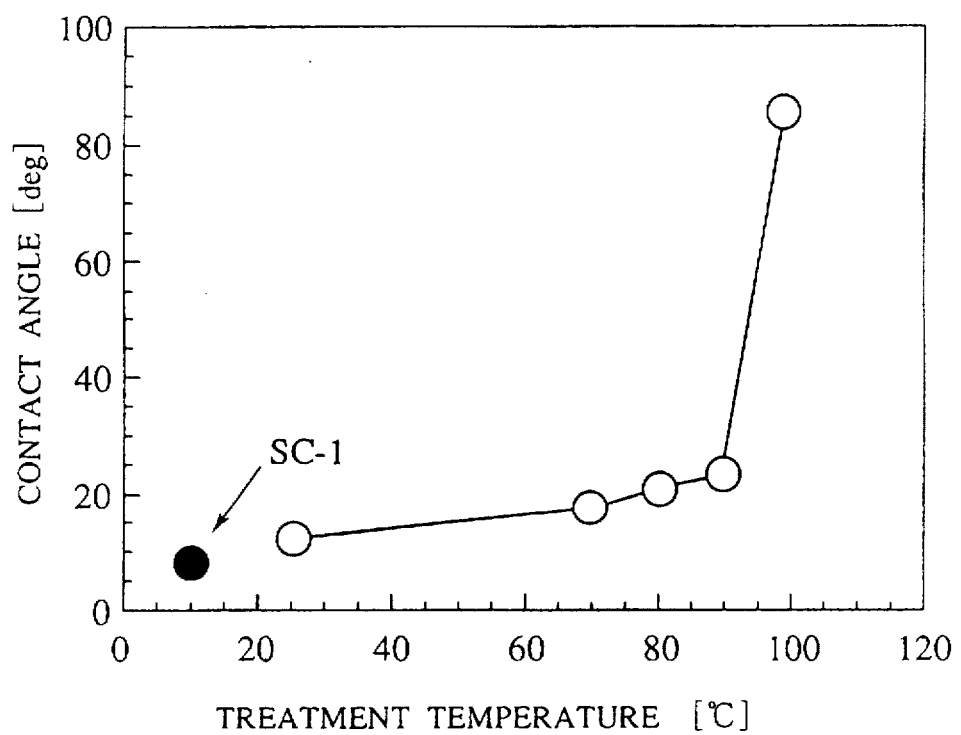
FIG. 7 shows a graph of relationships between contact angles with the semiconductor substrates cleaned by the semiconductor substrate cleaning method according to the embodiment of the present invention, and treatment temperatures.
Figure 8:
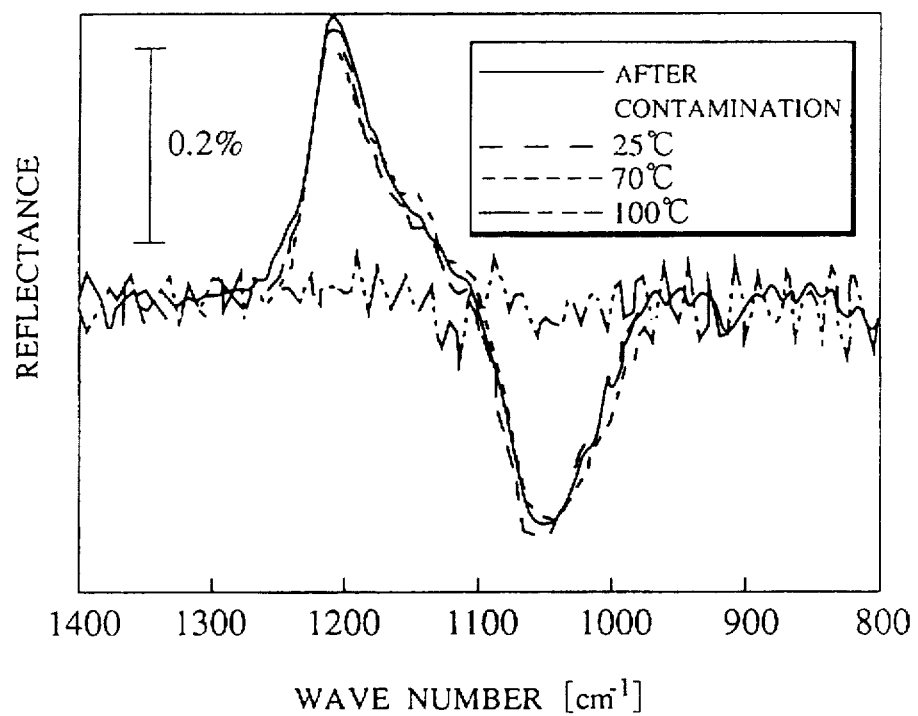
FIG. 8 shows FT-IR RAS spectra measured on the contaminated semiconductor substrate, cleaned by the semiconductor substrate cleaning method according to the embodiment of the present invention, before and after immersion in pure water having a lower dissolved oxygen concentration.
Figure 9:
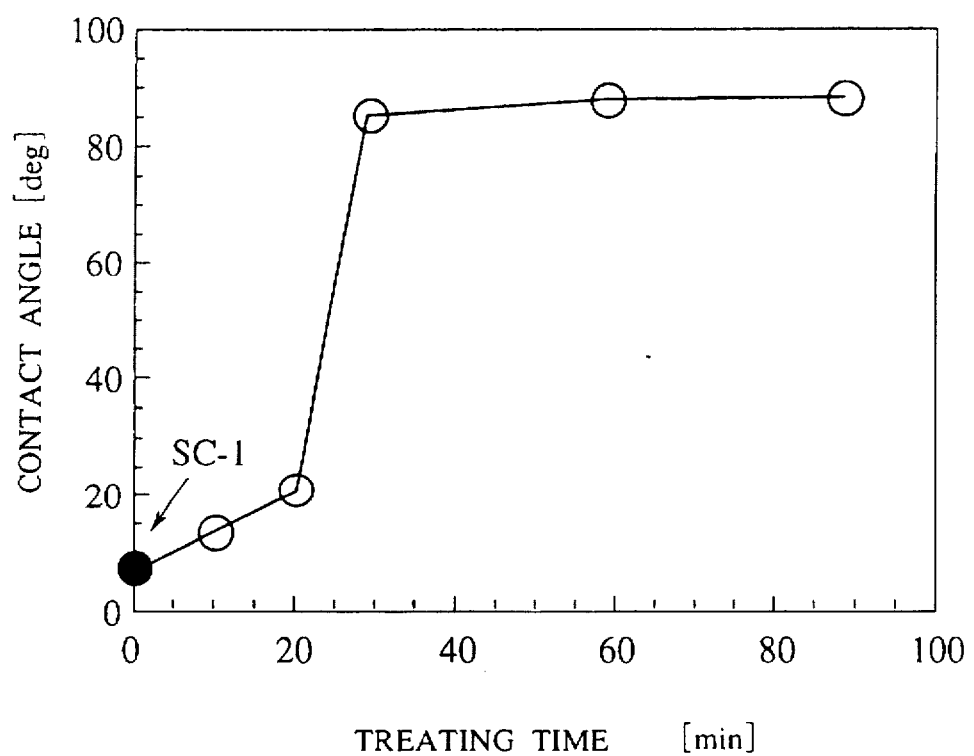
FIG. 9 shows a graph of relationships between contact angles with the semiconductor substrates cleaned by the semiconductor substrate cleaning method according to the embodiment of the present invention, and treatment time.
Figure 10:
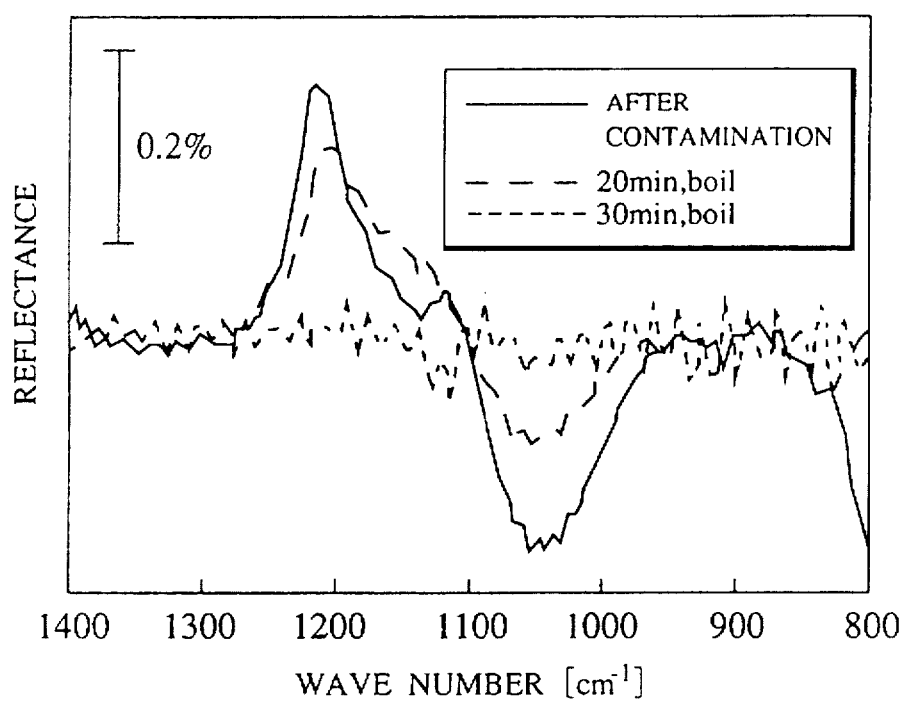
FIG. 10 shows FT-IR RAS spectra measured on the semiconductor substrate, cleaned by the semiconductor substrate cleaning method according to the embodiment of the present invention, before and after immersion in pure water having a lower dissolved oxygen concentration.
Figure 11:
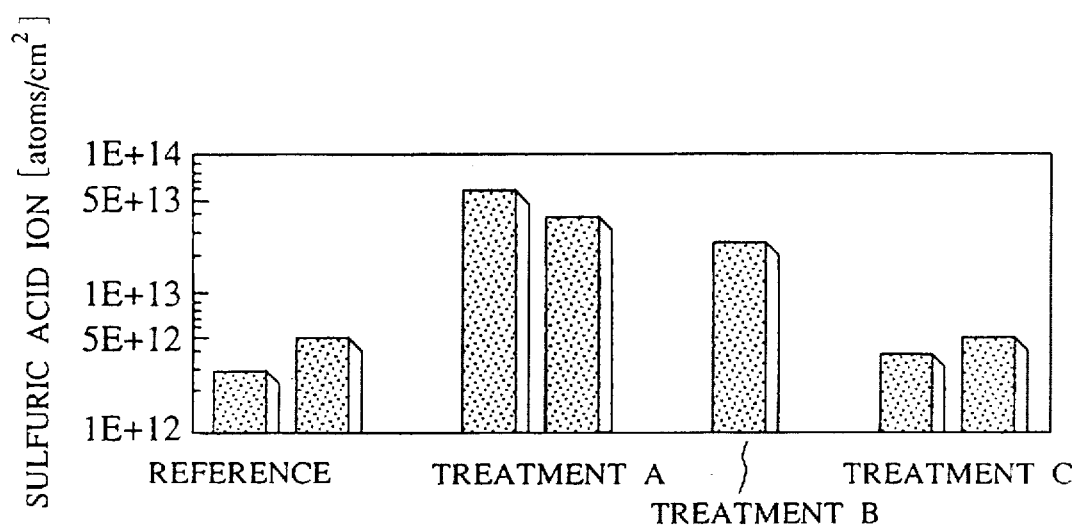
FIG. 11 shows a graph of residual sulfuric acid ion amounts on semiconductor substrates cleaned by the semiconductor substrate cleaning method according to the embodiment of the present invention.

FIG. 5 shows the depth profile of the contaminant Al measured by XPS (X-ray photoelectron spectroscopy). FIG. 6A shows the result of TRXF (total reflection X-ray fluorescence analysis) observation on the contaminated semiconductor substrates. FIG. 6B shows a graph explaining FIG. 6A. FIG. 7 shows a graph of relationships between contact angles with the cleaned semiconductor substrates and treatment temperatures. FIG. 8 shows the change in the FT-IR RAS spectra after immersion in pure water having a lower dissolved oxygen concentration. FIG. 9 shows a graph of contact angles with the cleaned semiconductor substrates and treatment temperatures. FIG. 10 shows the change in the FT-IR RAS spectra after immersion in pure water having a lower dissolved oxygen concentration. FIG. 11 shows a graph of amounts of residual sulfuric acid ions on the cleaned semiconductor substrates.

First, measured results of depth profile of metallic contaminants in the contaminated samples prepared by the present embodiment will be explained.

FIG. 5 shows the depth profile of the contaminant Al measured by XPS, of the surfaces of the semiconductor substrates immediately after contamination. In FIG. 5, the dotted line indicates interfaces between oxide films and the semiconductor substrates, and the one-dot chain line indicates the surfaces of the oxide films. As shown, it is found that Al of the metallic contaminants is present in the oxide films and near the surfaces.

FIG. 6A shows the result of TRXF observation on the surfaces of the semiconductor substrate immediately after contamination. As shown in FIG. 6B, the metallic contamination has different peak positions depending on particle contamination or molecular surface contamination. All the metallic contaminants have increasing intensities with increases of incident angles of X-rays, in which the metallic contaminants are present in molecular states.

Based on this result, it was found that metallic contaminants on the semiconductor substrate are not present like particles, but the metals were in the oxide films or were adhered to the surfaces of the oxide films. That is, it is possible that when the metallic contaminants are removed by the use of low dissolved-oxygen pure water, chemical condition and surface morphology of semiconductor substrates may be affected.

FIG. 7 shows the dependence of treatment temperature and contact angle with the wafer surfaces with a dissolved oxygen concentration in the pure water set at 1 ppb and with treatment time set at 30 minutes.

As shown, before the treatment with the low dissolved oxygen pure water, the surfaces of the semiconductor substrates are hydrophilic because of grown oxide films, i.e., they have small contact angles (indicated by ⬤n FIG. 7). In the treatment with the low dissolved-oxygen pure water, with higher treatment temperatures contact angles gradually increased. The changes were small at temperatures below 90° C., and the semiconductor substrate surfaces remained hydrophilic. But when the treatment temperature was above 100° C., contact angles greatly increased, and the semiconductor substrate surfaces changed to be hydrophobic.

The surface conditions of the semiconductor substrates at this time were estimated by FT-IR. As shown in FIG. 8, it was found that a peak of Si—O bonds observed at treatment temperatures below 70° C. disappeared at a 100° C. treatment temperature, and oxide films were removed.

With a dissolved oxygen concentration in the pure water set to 1 ppb and with a treatment temperature set at 100° C. (FIG. 9), the value of the contact angle dramatically increases by the immersion of more than 30 minutes, and the semiconductor substrate surfaces changed to be hydrophobic. The amounts of Si—O bonds were detected by FT-IR, and it was found that peaks were eliminated by the 30 minute-treatment, and oxide films were removed (FIG. 10).

As described above, when a dissolved oxygen concentration in the pure water was set to 1 ppb, and treatment time was set at 30 minutes, the amounts of metals absorbed on the semiconductor substrate surfaces with treatment time set at 30 minutes were greatly decreased. Based on these facts, the change of the semiconductor substrate surfaces from hydrophilicity to hydrophobicity is considered to be due to the oxide films on the semiconductor substrate surfaces being removed. And simultaneously therewith, the metallic contaminants absorbed on the semiconductor substrate surfaces were removed. The equilibrium of the removing effect in FIG. 4 is considered to be due to the oxide films all being removed.

In the present embodiment, only the effect of removing metallic contaminants was thus evaluated, but it is considered that organic impurities, fine particles, etc. adhered to oxide films can be removed by etching for the oxide films.

Next, the effect of removing residual chemical after a chemical treatment will be explained.

FIG. 11 shows the amounts of residual sulfuric acid ion after the semiconductor substrates were immersed in a mixed liquid of hydrogen peroxide and sulfuric acid and then cleaned with various kinds of pure water. In FIG. 11, Treatment A is a treatment with 8 ppb dissolved-oxygen concentration in pure water of 25° C. after a chemical treatment. Treatment B is a treatment with 1 ppb dissolved-oxygen concentration in pure water of 25° C. Treatment C is a treatment with 1 ppb dissolved-oxygen concentration in pure water at 100° C. after a chemical treatment. A reference wafer was treated with a mixed liquid of ammonium and hydrogen peroxide, and next treated with nitric acid.

As shown, it was found that Treatment C could reduce a residual sulfuric acid ion density down to about 1/10 that of treatments A and B, which was substantially the same as a residual sulfuric acid ion density of Reference wafer.

As described above, in the semiconductor cleaning method according to the present embodiment, for cleaning the surfaces of semiconductor substrates by the use of pure water of a low dissolved-oxygen concentration, the semiconductor substrates are immersed in the pure water heated to a temperature above 60° C. in an atmosphere which allows the dissolved-oxygen concentration in the pure water to be kept for etching of oxide films formed on the surfaces of the semiconductor, whereby the surfaces of the semiconductor substrates were cleaned. Accordingly, contaminants and residual chemicals can be effectively removed without adding chemical treatment steps.

The cleaning of semiconductor substrates by the use of low dissolved-oxygen concentration in pure water does not use chemicals of high viscosities. The surfaces of semiconductor substrates can be cleaned without residual chemicals.

Water cleaning with the above-described low dissolved-oxygen concentration in pure water following a chemical treatment can effectively reduce residual chemicals in comparison with water cleaning with pure water having a' dissolved oxygen concentration not controlled or dissolved oxygen pure water at below 60° C.

The cleaning method can remove contaminants without residual chemicals, whereby semiconductor devices of high quality can be provided without lowering product yields.

In the above-described embodiment, cleaning of semiconductor substrates with the so-called chemical oxide films formed by SC-1 treatment was explained. But cleaning with low dissolved-oxygen pure water, which is effected by etching oxide films on the surfaces of semiconductor substrates, may be used in removing native oxide films formed by leaving semiconductor substrates in an atmosphere containing oxygen or immersing the semiconductor substrates in pure water with a higher dissolved-oxygen amount. For example, in pre-treatments for forming films of electrode materials, cleaning is conducted with low dissolved-oxygen pure water for cleaning of the surfaces of semiconductor substrates concurrent with removal of native oxide films.

As described above, contaminants adhered to the surfaces of semiconductor substrates can be removed by immersing for more than 10 minutes in pure water of a below 200 ppb dissolved oxygen concentration which has been heated to above 60° C., and it is preferred that parameters to this end are optimized based on device structures.

For example, a temperature of the pure water and a period of time during which semiconductor substrates are immersed are set so that a contact angle formed between the pure water and the semiconductor substrates after cleaning of the semiconductor substrates is above 70° which is formed between pure water and a silicon substrate, with no oxide film formed thereon, whereby all oxide films can be removed. Contaminants on the surfaces of semiconductor substrates can be effectively removed.

Figure 12:
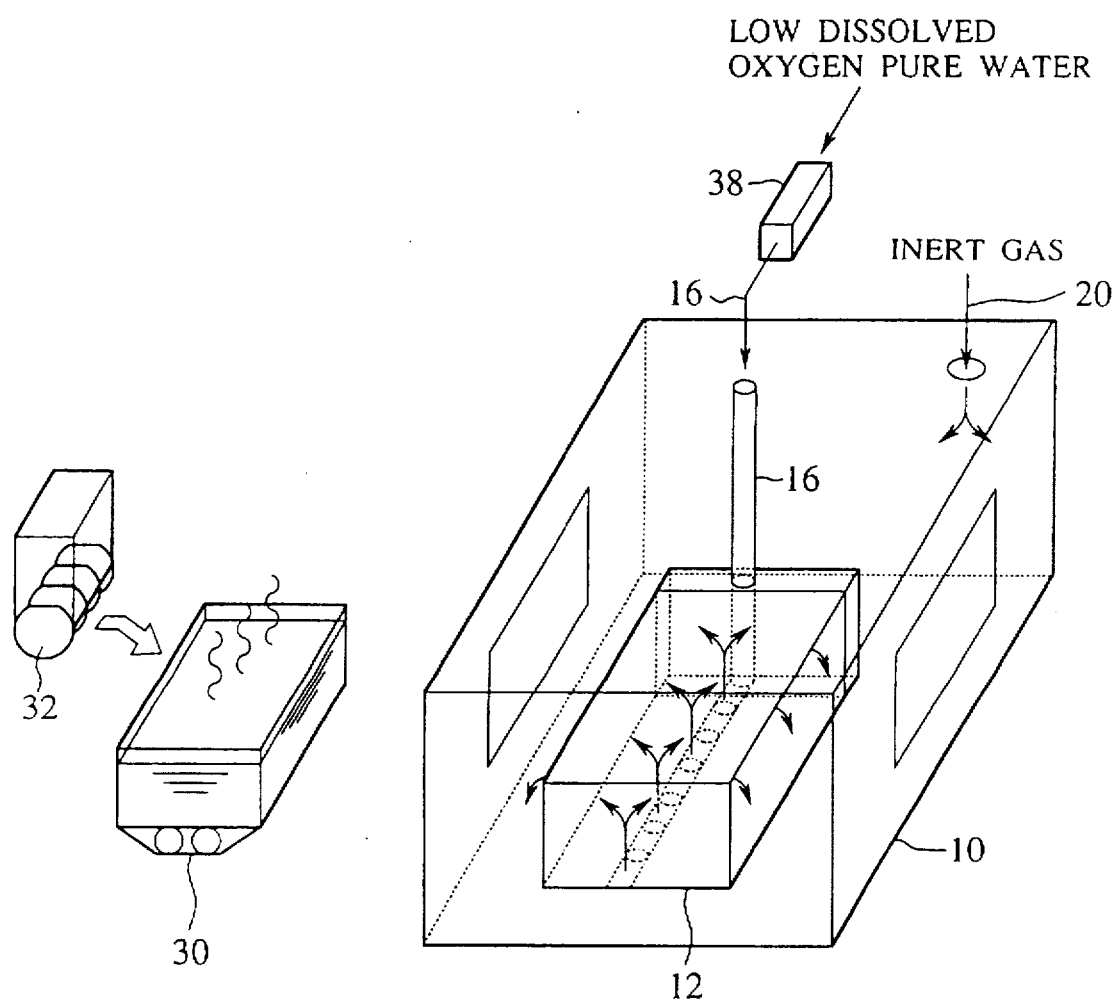
FIG. 12 shows a schematic view of the semiconductor substrate cleaning equipment according to a first variation of the present invention.

Next, three variations of the method according to the present invention will now be explained with reference to FIGS. 12, 13 and 14.

In the process for fabricating a semiconductor device, usually chemical treatments and water cleaning are repeated to remove fine particles, metallic contaminants, organic substances, etc. To this end, a chemical bath for treatments by chemicals and a pure water bath for the water cleaning are needed. As exemplified in FIG. 12, semiconductor substrate cleaning equipment is constituted with a chemical bath 30, and a pure water bath 12 provided in the closed unit of a box 10 or the like disposed in a usual draft chamber, so that semiconductor substrates 32 are subjected to a chemical treatment in the chemical bath 30, then loaded into the closed unit in which an atmosphere of an adjusted oxygen concentration is established, and are subjected to water cleaning by low dissolved-oxygen pure water in the pure water bath 12.

In this case, when the chemically treated semiconductor substrates are loaded into the closed unit, it is preferred to sustain a gas atmosphere in the closed unit. To this end a pass box 26 is provided between the closed unit and the outside air as shown in FIG. 1, whereby the cleaning can be conducted without disturbing the gas atmosphere in the closed unit.

Figure 13:
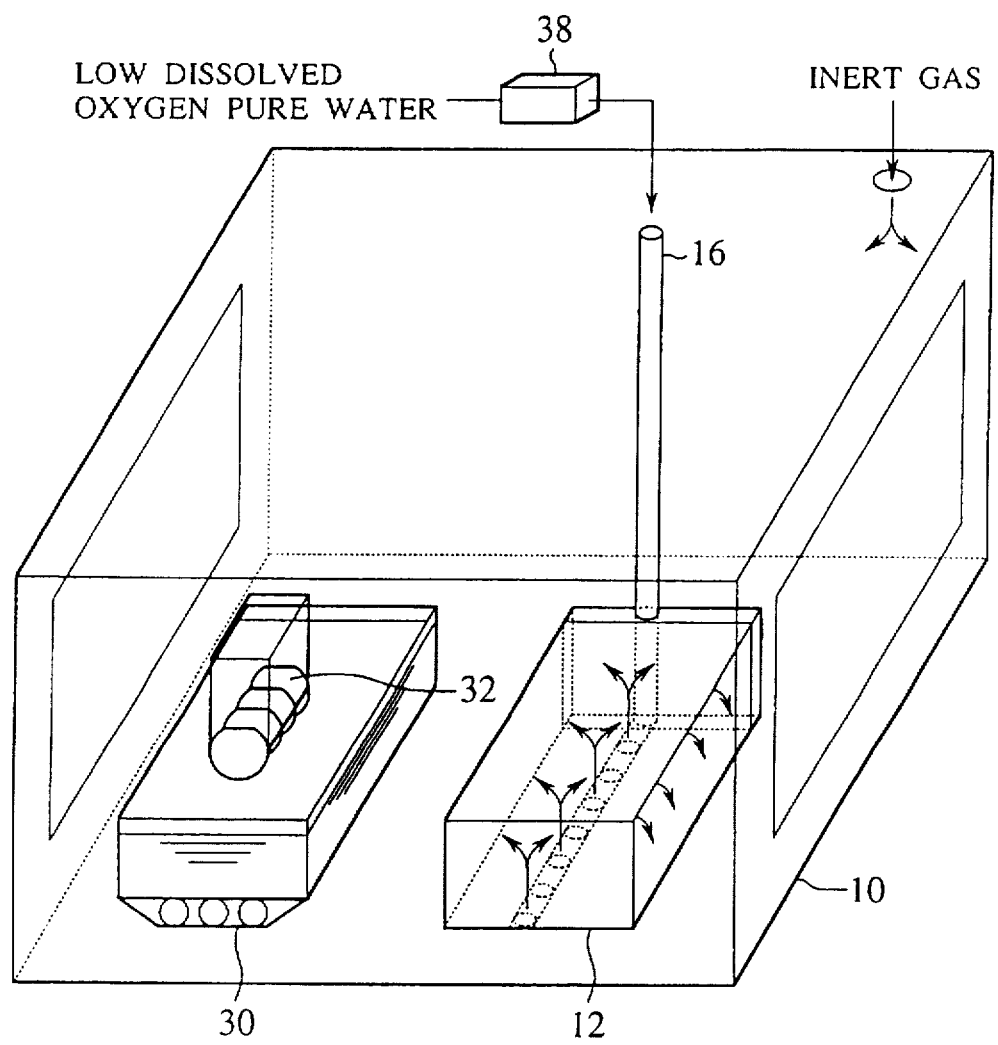
FIG. 13 shows a schematic view of the semiconductor substrate cleaning equipment according to a second variation of the present invention.

As shown in FIG. 13, it is possible that the chemical bath 30 and the pure water bath 12 are disposed in the same closed unit with an atmosphere having an adjusted oxygen concentration.

In the above-described embodiment, an atmosphere in the box 10 was controlled so that an oxygen concentration was below 25 ppm in 25° C. atmospheric pressure. But it is preferred to control the oxygen concentration in an atmosphere so that the oxygen concentration in the closed unit can keep a dissolved oxygen concentration in the pure water. That is, the oxygen concentration in an atmosphere is controlled so as to satisfy Henry's law.

The pure water bath is provided in the closed unit to prevent outside oxygen from solving in the low dissolved-oxygen pure water for obtaining a high cleaning effect. It is not essential to close in the pure water bath with the closed unit as long as the cleaning equipment is so constituted that the low dissolved-oxygen pure water is kept out of contact with outside oxygen.

Figure 14:
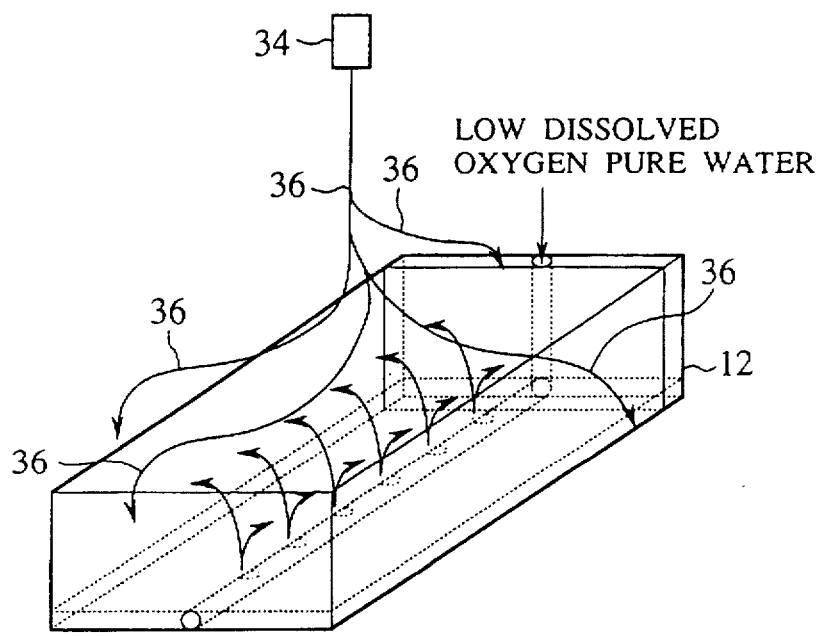
FIG. 14 shows a schematic view of the semiconductor substrate cleaning equipment according to a third variation of the present invention.

As exemplified in FIG. 14, one or a plurality of inert gas injection ports 34 are provided above the pure water bath 12, so that inert gas streams 36 which cover the surface of the pure water bath 12 with the inert gas are generated. Outside air does not solve into the low dissolved-oxygen pure water, and semiconductor substrates can be cleaned with a dissolved oxygen concentration kept low.

Otherwise, for example, inert gas injection ports are provided in the walls of the pure water bath, or near the pure water bath and above the surface of the pure water, and inert gas exhaust ports are provided opposed to the injection ports across the pure water bath, so that the inert gas is caused to flow horizontally.

In the above-described embodiment, the low dissolved-oxygen pure water is heated by the heater 14 provided in the pure water bath 12. But as shown in FIGS. 12 and 13, pure water may be heated through heating means 38 before being fed into the cleaning equipment. In this case, overflow rinse, etc. are possible with the low dissolved oxygen pure water, whereby removed contaminants do not remain in the pure water bath 12, which may enhances the contaminant removing effect.

What is claimed is:

1. A semiconductor substrate cleaning method comprising an immersing step of immersing a semiconductor substrate having an oxide film formed thereon in pure water having a dissolved oxygen concentration of below 200 ppb at room temperature and a temperature above 60° C., in an atmosphere which controls oxygen concentration to keep the dissolved oxygen concentration in the pure water, whereby the semiconductor substrate is cleaned to etch the oxide film.

2. A semiconductor substrate cleaning method according to claim 1, further comprising a shielding step of shielding the atmosphere from an outside air during the immersing step so as to keep the dissolved oxygen concentration in the pure water.

3. A semiconductor substrate cleaning method according to claim 2, further comprising an adjusting step of adjusting an oxygen concentration in the atmosphere during the shielding step so as to keep the dissolved oxygen concentration in the pure water.

4. A semiconductor substrate cleaning method according to claim 1, wherein the immersing step is conducted for more than 10 minutes.

5. A semiconductor substrate cleaning method according to claim 1, wherein the pure water is at a temperature above 80° C.

6. A semiconductor substrate cleaning method according to claim 1, wherein the pure water is at a temperature above 90° C.

7. A semiconductor substrate cleaning method according to claim 1, further comprising a controlling step of controlling a temperature of the pure water and a time of immersing the semiconductor substrate in the pure water during the immersing step so as to form a contact angle of the semiconductor substrate after cleaning of above 70°.

8. A semiconductor substrate cleaning method according to claim 1, wherein the oxide film on the surfaces of the semiconductor substrate is a chemical oxide film formed by immersing the semiconductor substrate in a chemical solution.

9. A semiconductor substrate cleaning method according to claim 8, wherein the chemical solution is a mixture of ammonium water, hydrogen peroxide and pure water.

10. A semiconductor substrate cleaning method according to claim 1, wherein the oxide film on the surface of the semiconductor substrate is a native oxide film formed by letting the semiconductor substrate be exposed in an oxygen-content atmosphere, or immersing the semiconductor substrate in pure water having a higher dissolved oxygen concentration than said dissolved oxygen concentration.

11. A semiconductor device fabrication method comprising plural steps of forming a semiconductor device on a semiconductor substrate wherein at least one step of the plural steps is a step of cleaning a surface of the semiconductor substrate, which has an oxide film formed thereon, by the semiconductor substrate cleaning method according to claim 1, whereby said oxide film is etched.

* * * * *